US011110599B2

(12) United States Patent
Goto et al.

(10) Patent No.: US 11,110,599 B2
(45) Date of Patent: *Sep. 7, 2021

(54) ROBOT, CONTROL DEVICE OF ROBOT, AND METHOD OF TEACHING POSITION OF ROBOT

(71) Applicant: KAWASAKI JUKOGYO KABUSHIKI KAISHA, Kobe (JP)

(72) Inventors: Hirohiko Goto, Akashi (JP); Tetsuya Yoshida, Kakogawa (JP); Haruhiko Tan, Kobe (JP); Kazuo Fujimori, Akashi (JP); Katsuhiro Yamashita, Kakogawa (JP); Masahiko Sumitomo, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 328 days.

This patent is subject to a terminal disclaimer.

(21) Appl. No.: 16/337,584

(22) PCT Filed: Sep. 26, 2017

(86) PCT No.: PCT/JP2017/034696
§ 371 (c)(1),
(2) Date: Mar. 28, 2019

(87) PCT Pub. No.: WO2018/062156
PCT Pub. Date: Apr. 5, 2018

(65) Prior Publication Data
US 2020/0030973 A1    Jan. 30, 2020

(30) Foreign Application Priority Data

Sep. 28, 2016 (JP) .............................. JP2016-189149

(51) Int. Cl.
*B25J 9/16* (2006.01)
*H01L 21/687* (2006.01)

(52) U.S. Cl.
CPC ........... *B25J 9/1612* (2013.01); *B25J 9/1697* (2013.01); *H01L 21/68707* (2013.01)

(58) Field of Classification Search
USPC ................................................ 700/245–264
See application file for complete search history.

(56) References Cited

U.S. PATENT DOCUMENTS 4,871,252 A * 10/1989 Beni ...................... G01B 9/021
356/457
10,978,330 B2 * 4/2021 Yin .................... H01L 21/68707
(Continued)

FOREIGN PATENT DOCUMENTS

JP    2007-088110 A    4/2007

*Primary Examiner* — Jonathan L Sample
(74) *Attorney, Agent, or Firm* — Oliff PLC

(57) ABSTRACT

A control device of a robot includes: an image data acquirer acquiring image data taken by a camera, the image data including a hand teaching substrate and substrate placing portion, the teaching substrate arranged as a teaching target at a substrate target position; a virtual substrate information generator generating information of a virtual substrate virtually arranged at the hand substrate placing portion in the image data; an operating unit receiving an input and generate operation information corresponding to the input; a screen display unit displaying an image of the teaching substrate and an image of the virtual substrate on a screen; a robot operation control unit controlling an operation of the robot arm in accordance with the operation information; and a teaching data record unit storing, as teaching data, a position of the hand when the virtual substrate has coincided with the teaching substrate.

20 Claims, 10 Drawing Sheets

(56) References Cited

U.S. PATENT DOCUMENTS

| | | | |
|---|---|---|---|
| 2002/0068992 A1* | 6/2002 | Hine | H01L 21/68707 700/229 |
| 2004/0202362 A1* | 10/2004 | Ishikawa | B25J 9/1692 382/153 |
| 2006/0106497 A1* | 5/2006 | Ishikawa | H01L 21/67259 700/259 |
| 2013/0226335 A1* | 8/2013 | Kraus | H01L 21/681 700/228 |
| 2013/0310977 A1* | 11/2013 | Tsusaka | B25J 9/163 700/257 |
| 2014/0195052 A1* | 7/2014 | Tsusaka | A61B 34/76 700/257 |
| 2014/0365011 A1* | 12/2014 | Hosek | B25J 9/1682 700/259 |
| 2016/0129586 A1* | 5/2016 | Moura | H01L 21/67742 700/228 |
| 2017/0018446 A1* | 1/2017 | Yin | H01L 21/68707 |
| 2019/0344446 A1* | 11/2019 | Goto | B25J 9/1697 |

\* cited by examiner

ROBOT, CONTROL DEVICE OF ROBOT, AND METHOD OF TEACHING POSITION OF ROBOT

TECHNICAL FIELD

The present invention relates to a robot, a control device of the robot, and a method of teaching a position of the robot.

BACKGROUND ART

In the field of semiconductor devices and liquid crystal devices, teaching of robots is becoming more difficult due to an increase in complexity of the devices and an increase in size of carried objects. Teaching correct positions to robots is extremely important for reliability of the robots. Under such circumstances, teaching errors caused by insufficient skills of operators are serious problems.

There is a conventional method of teaching an operation to a robot in such a way that while watching a robot, an operator uses a teaching portable operation terminal (teaching pendant) to perform remote control of the robot. For example, PTL 1 discloses a teaching method in which: an operator performs an inching operation of a substrate carrying robot by a teaching box; and while confirming on a monitor an image taken by a camera provided at a tip end of a hand, the operator adjusts a position of the hand member in a proceeding direction to an optimal position.

CITATION LIST

Patent Literature

PTL 1: Japanese Laid-Open Patent Application Publication No. 2007-88110

SUMMARY OF INVENTION

Technical Problem

However, when performing the remote control of the robot as in the conventional method, the operator can watch the robot in the semiconductor device only from the outside of the semiconductor device. Therefore, the operator has to watch the device from an oblique direction or from right above to confirm a distance between the robot and a target position. Such work is complex. Further, according to the method of simply confirming the image of the camera on the monitor as in PTL 1, there is a problem that a teaching error may occur due to an insufficient skill of the operator regarding the teaching of the robot.

The present invention was made to solve the above problems, and an object of the present invention is to easily and accurately teach the position of a hand to a robot even if the skill of an operator is insufficient.

Solution to Problem

To solve the above problems, a robot according to an aspect of the present invention is a robot configured to carry a substrate to a substrate target position at which the substrate is to be placed, the robot including: a robot arm; a hand attached to a tip end of the robot arm; a camera fixed and attached to a portion of the hand other than a substrate placing portion of the hand so as to take an image of the substrate placing portion, the substrate being placed at the substrate placing portion; an image data acquirer configured to acquire image data taken by the camera, the image data including a teaching substrate and the substrate placing portion of the hand, the teaching substrate being arranged as a teaching target at the substrate target position; a virtual substrate information generator configured to generate information of a virtual substrate virtually arranged at the substrate placing portion of the hand in the image data; an operating unit configured to receive an input and generate operation information corresponding to the input; a screen display unit configured to display an image of the teaching substrate and an image of the virtual substrate on a screen; a robot operation control unit configured to control an operation of the robot arm in accordance with the operation information generated by the operating unit; and a teaching data record unit configured to store, as teaching data, a position of the hand when the virtual substrate has coincided with the teaching substrate.

According to the above configuration, the virtual substrate generated on the substrate placing portion of the hand is displayed on the screen by the screen display unit together with the teaching substrate arranged as the teaching target at the substrate target position. On this account, the operator can control the operation of the robot arm by operating the operating unit while watching the screen such that the virtual substrate coincides with the teaching substrate. By storing the position of the hand at this time as the teaching data, the position of the hand corresponding to the target position can be taught to the robot. With this, even if the skill of the operator is insufficient, the position of the hand can be easily and accurately taught to the robot. Herein, "storing the position of the hand as the teaching data" denotes that the position of the hand is stored (registered) as information, such as the operation program, that is reproducible by, for example, a robot controller. It should be noted that the camera may be fixed and attached to a base end portion of the hand.

The robot may further include a distance information calculator configured to calculate distance information from the substrate placing portion to the teaching substrate based on the image data of the camera, wherein the screen display unit displays on the screen an operation guide configured to guide a position of the hand based on the distance information from the substrate placing portion to the teaching substrate such that the virtual substrate coincides with the teaching substrate.

According to the above configuration, since the operation guide for guiding the position of the hand such that the virtual substrate coincides with the teaching substrate is displayed on the screen, the operator can easily operate the operation guide.

The distance information calculator may calculate the distance information from the substrate placing portion to the teaching substrate by pattern matching between the image of the virtual substrate and the image of the teaching substrate.

The operation guide may include: an upward-downward guide portion configured to guide the position of the hand in an upper-lower direction; a leftward-rightward guide portion configured to guide the position of the hand in a left-right direction; and a forward-backward guide portion configured to guide the position of the hand in a front-rear direction.

According to the above configuration, the operator can more easily operate the position of the hand in the upper-lower direction, the front-rear direction, and the left-right direction.

The screen display unit may include a touch panel configured such that an operator touches the upper-downward guide portion, the left-right direction guide portion, or the front-rear direction guide portion on the screen to input the position of the hand in the upper-lower direction, the left-right direction, or the front-rear direction.

According to the above configuration, the operator can touch each guide portion on the screen to input the position of the hand, and therefore, the operator can easily operate the position of the hand.

The robot may be configured such that: when the hand is directed in such a direction that the virtual substrate coincides with the teaching substrate, the operation guide is displayed in a first color; and when the hand is not directed in the direction, the operation guide is displayed in the other color.

According to the above configuration, since the operator can determine based on the color on the screen whether or not a teaching state is correct, the operator can more easily operate the position of the hand.

The operating unit and the display unit may be mounted on a portable operation terminal.

A control device of a robot according to another aspect of the present invention is a control device of a robot, the robot including: a robot arm; a hand attached to a tip end of the robot arm; and a camera fixed and attached to a portion of the hand other than a substrate placing portion of the hand so as to take an image of the substrate placing portion, a substrate being placed at the substrate placing portion, wherein the robot carries the substrate to a substrate target position at which the substrate is to be placed, the control device including: an image data acquirer configured to acquire image data taken by the camera, the image data including a teaching substrate and the substrate placing portion of the hand, the teaching substrate being arranged as a teaching target at the substrate target position; a virtual substrate information generator configured to generate information of a virtual substrate virtually arranged at the substrate placing portion of the hand in the image data; an operating unit configured to receive an input and generate operation information corresponding to the input; a screen display unit configured to display an image of the teaching substrate and an image of the virtual substrate on a screen; a robot operation control unit configured to control an operation of the robot arm in accordance with the operation information; and a teaching data record unit configured to store, as teaching data, a position of the hand when the virtual substrate has coincided with the teaching substrate.

A method of teaching a position of a robot according to yet another aspect of the present invention is a method of teaching a position of a hand of a robot configured to carry a substrate to a substrate target position at which the substrate is to be placed, the method including: arranging a teaching substrate as a teaching target at the substrate target position; fixing and attaching a camera to a portion of the hand other than a substrate placing portion of the hand such that the camera takes an image of the substrate placing portion, the substrate being placed at the substrate placing portion; moving the robot to a predetermined position at which the camera is able to taken an image of the teaching substrate and the substrate placing portion of the hand; taking the image of the teaching substrate and the substrate placing portion of the hand by the camera; generating information of a virtual substrate virtually arranged at the substrate placing portion of the hand in image data taken by the camera; receiving an input and generating operation information corresponding to the input by an operating unit; displaying an image of the teaching substrate and an image of the virtual substrate on a screen by a screen display unit; controlling an operation of the robot arm in accordance with the operation information; and storing in a storage unit as teaching data, a position of the hand when the virtual substrate has coincided with the teaching substrate.

Advantageous Effects of Invention

An object of the present invention is to easily and accurately teach the position of the hand to the robot even if the skill of the operator is insufficient.

DESCRIPTION OF EMBODIMENTS

An embodiment of the present invention will be explained with reference to the drawings. Hereinafter, the same reference signs are used for the same or corresponding components, and a repetition of the same explanation is avoided.

Embodiment

Semiconductor Processing Equipment

Figure 1:
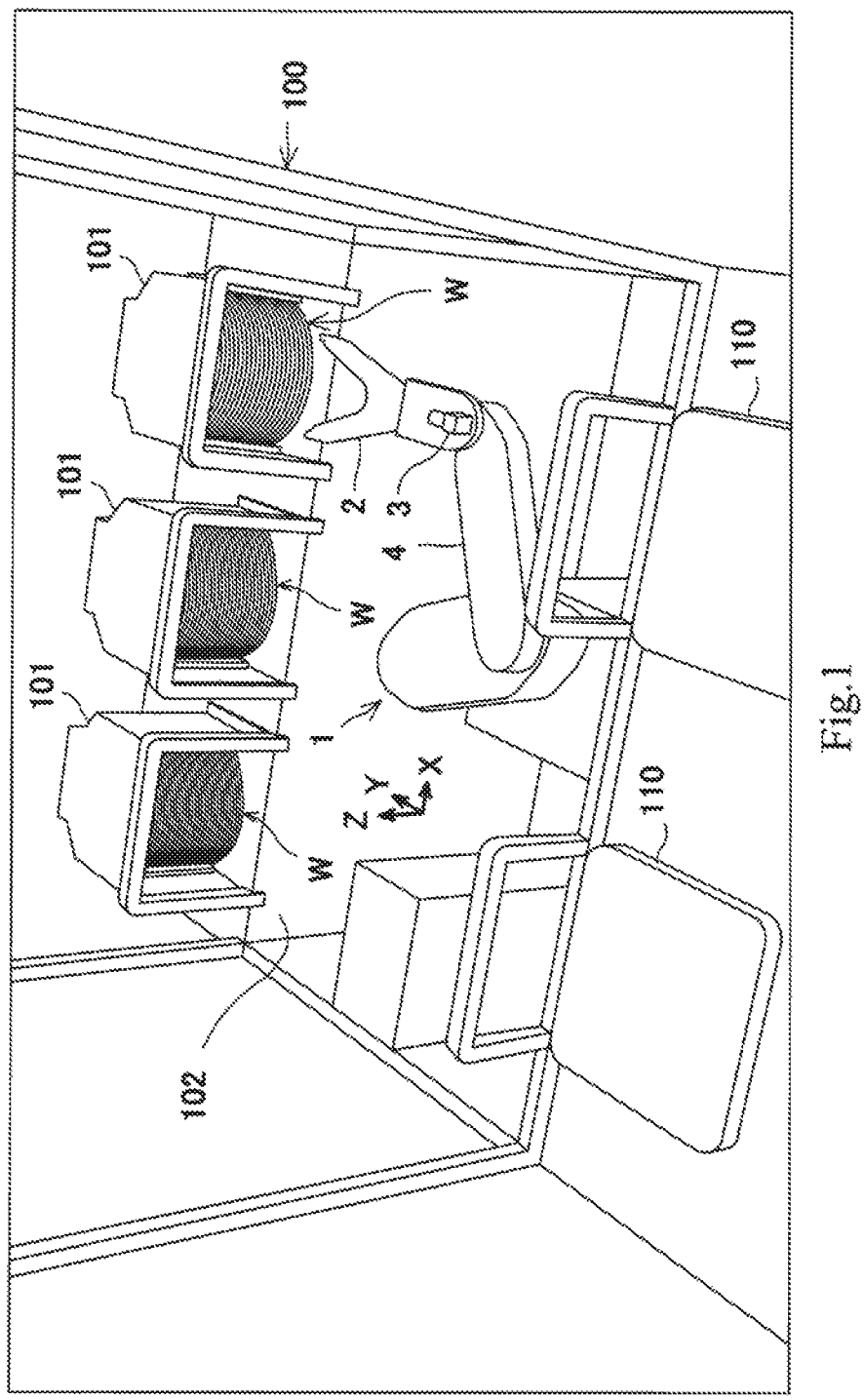
FIG. 1 is a perspective view schematically showing the configuration of semiconductor processing equipment including a robot according to an embodiment of the present invention.

FIG. 1 is a perspective view showing semiconductor processing equipment including a robot according to the embodiment of the present invention. Semiconductor processing equipment 100 is equipment for processing semiconductor wafers. Examples of the semiconductor wafers include silicon wafers, sapphire (single crystal alumina) wafers, and other various wafers. Further, examples of glass wafers include FPD (Flat Panel Display) glass substrates and MEMS (Micro Electro Mechanical Systems) glass substrates. The semiconductor processing equipment 100 is configured based on, for example, the SEMI (Semiconductor Equipment and Materials International) standards. In this case, a below-described FOUP 101 follows the specification of the SEMI standards. The semiconductor processing equipment 100 may be configured without being based on the SEMI standards.

Semiconductor wafers (hereinafter may be simply referred to as "substrates") W before and after processing are accommodated in a container called a Front Opening Unified Pod (FOUP) 101. The FOUP 101 is related to a local cleaning technology and is a mini-environment substrate container in a clean environment. A plurality of substrates W are accommodated in three FOUPs 101. The substrates W are horizontally accommodated in the FOUPs 101 and arranged at regular intervals in an upper-lower direction Z. Each of the FOUPs 101 is formed in a substantially box shape on a base 102 and is open toward one side. The semiconductor processing equipment 100 includes a substrate processing apparatus 110 configured to process the substrate W. Examples of the processing of the substrate W include process treatments, such as a heat treatment, an impurity introducing treatment, a thin film forming treatment, a lithography treatment, a cleaning treatment, and a flattening treatment. The substrate W is carried between the FOUP 101 and the substrate processing apparatus 110 by a robot 1.

Robot

Figure 2:
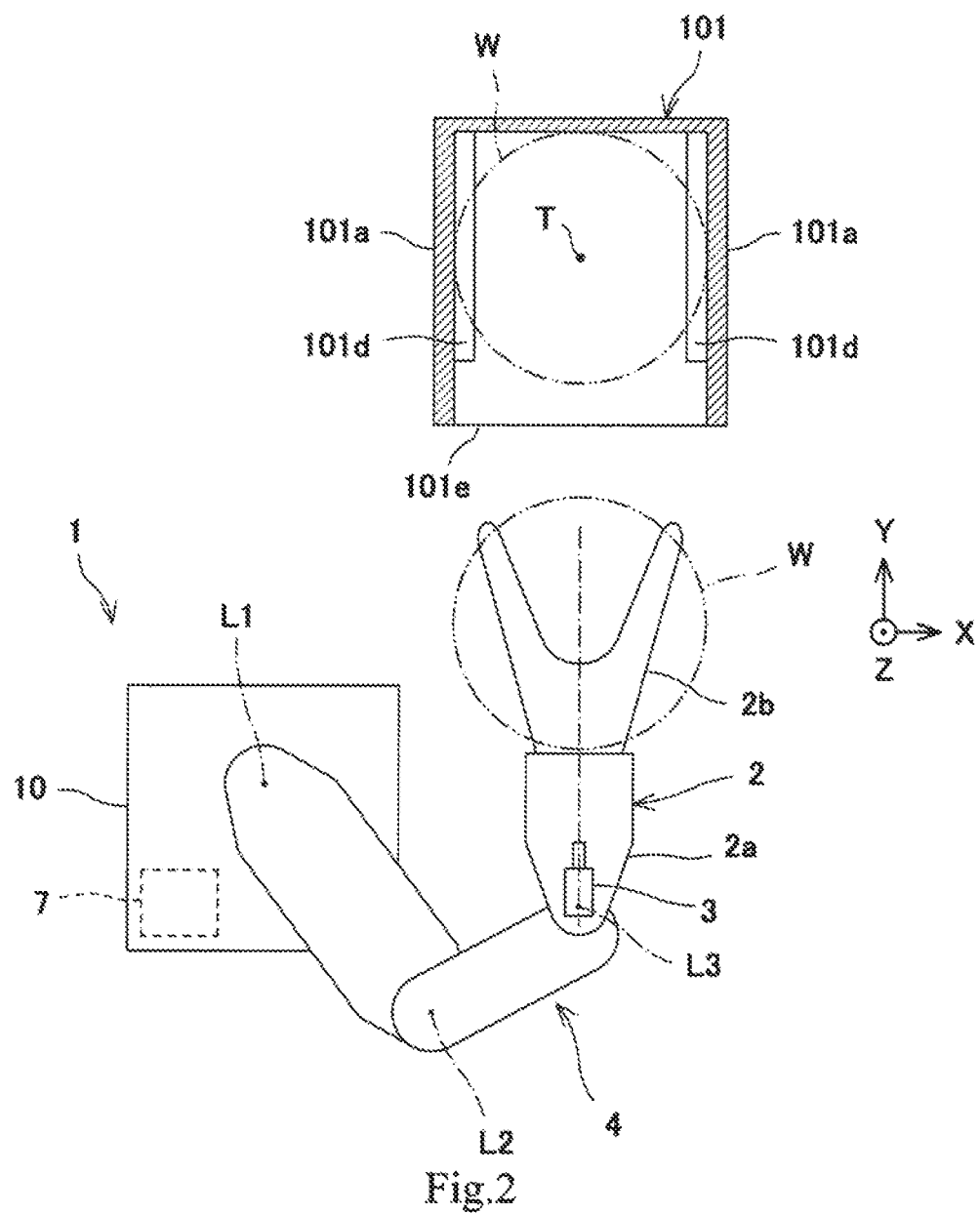
FIG. 2 is a plan view schematically showing the configurations of the robot and a FOUP.

FIG. 2 is a plan view schematically showing the configurations of the robot and the FOUP accommodating the substrate according to the embodiment of the present invention. The FOUP 101 is shown as an X-Y section. As shown in FIG. 2, the FOUP 101 includes: a pair of side walls 101a opposed to each other; and plural pairs of substrate supporting portions 101d provided at the side walls 101a. The substrate supporting portions 101d support end portions of the substrates W such that: each substrate W takes a horizontal posture; and the substrates W are lined up at intervals in the upper-lower direction. A front surface of the FOUP 101 constitutes a front-surface opening 101e that is open.

The robot 1 carries the substrate W out from the FOUP 101 and carries the substrate W in the FOUP 101 through the front-surface opening 101e. To be specific, the robot 1 is a robot configured to carry the substrate W to a substrate target position T at which the substrate W is to be placed. The robot 1 includes a robot arm 4 and a hand 2 attached to a tip end of the robot arm 4. The robot 1 takes out the substrate W from the FOUP 101 and puts the substrate W in the FOUP 101 by the hand 2. As shown in FIG. 2, for example, the substrate W supported by the substrate supporting portions 101d is a teaching target, and a center of the substrate W when viewed from a vertical direction is the substrate target position T. However, the present embodiment is not limited to this. The target position T is a position set such that: a below-described control unit of the robot 1 stores, as teaching data, the position of the hand when the teaching substrate W and a below-described virtual substrate have coincided with each other; and with this, the robot 1 can carry the substrate W out from the FOUP 101 and carry the substrate W in the FOUP 101. A camera 3 is fixed to a wrist (base end portion) 2a formed at a base end side of the hand 2 of the robot 1. In the present embodiment, the camera 3 is attached to the wrist 2a so as to be able to fixedly take an image of a blade 2b of the hand 2 but may be fixed and attached to a different portion except for the blade 2b. The camera 3 is constituted by a CCD (Charge Coupled Device) camera, a CMOS (Complementary Metal Oxide Semiconductor) camera, or the like. The blade 2b corresponds to a "substrate placing portion" of the hand 2 and is a portion at which the substrate W is placed.

Hereinafter, a direction in which a below-described rotation axis L1 of the robot 1 is referred to as a Z direction or the upper-lower direction. A direction perpendicular to the Z direction is referred to as an X direction or a left-right direction. A direction perpendicular to the Z direction and the X direction is referred to as a Y direction or a front-rear direction. In the present embodiment, the X direction is set as a direction from the robot 1 toward the FOUP 101 and its opposite direction.

Figure 3:
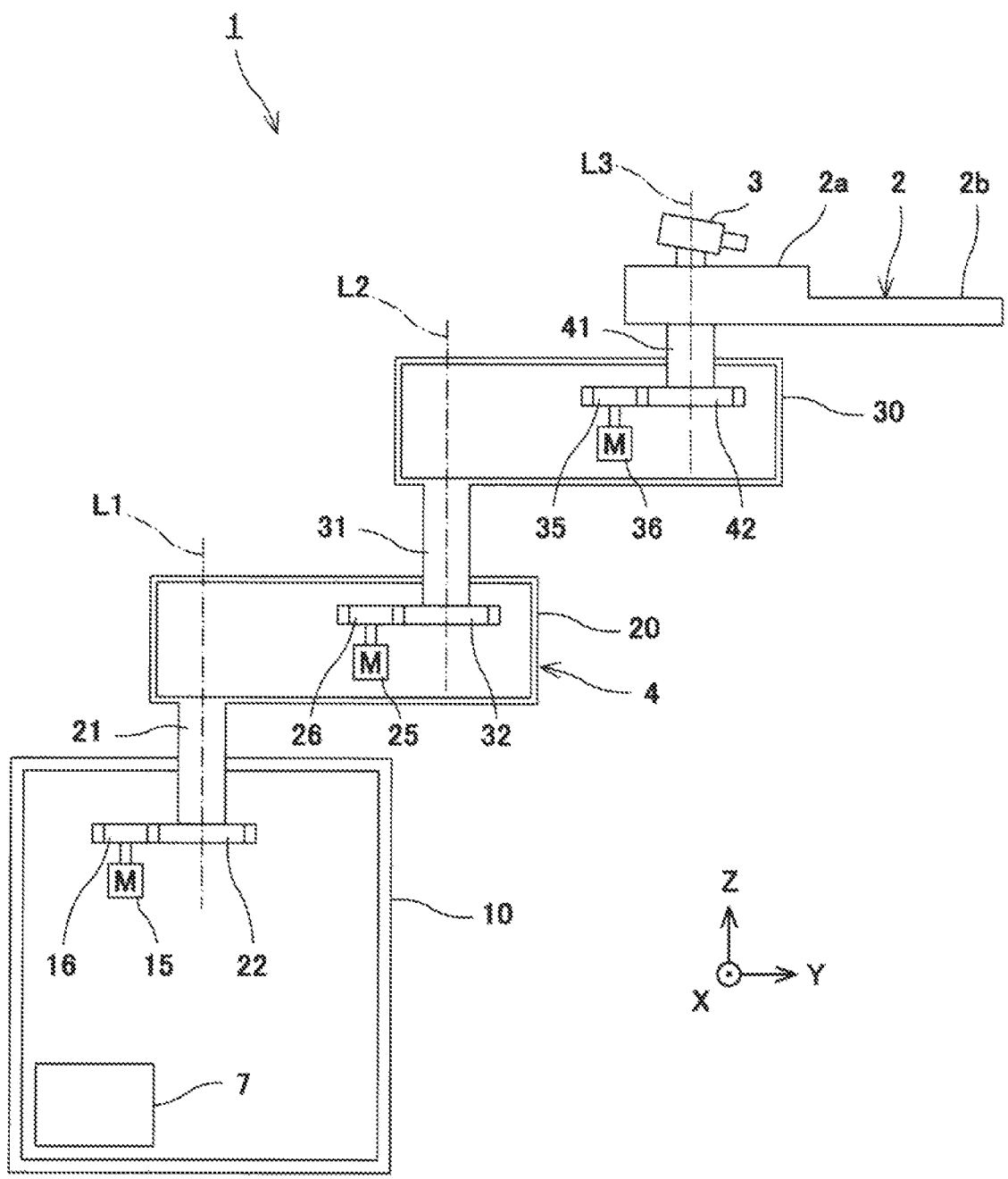
FIG. 3 is a diagram schematically showing the configuration of an internal mechanism of the robot.

FIG. 3 is a diagram schematically showing the configuration of an internal mechanism of the robot 1. As shown in FIG. 3, the robot 1 includes a base 10, the robot arm 4, the hand 2, the camera 3 attached to the hand 2, and a control device 7 configured to control an operation of the robot 1. The robot arm 4 is constituted by a lower arm 20 and an upper arm 30.

The base 10 is, for example, a hollow cylindrical member. A lower arm driving portion 15 and the control device 7 are provided in the base 10, and the lower arm driving portion 15 includes a servo motor and a lower arm turn main driving gear 16.

The robot 1 includes a lifting mechanism (not shown). For example, the lifting mechanism includes a known ball screw mechanism (not shown) and an encoder-equipped servo motor (not shown) configured to drive the ball screw mechanism. The ball screw mechanism lifts and lowers in the Z direction a movable body (not shown) at which a lower arm rotating shaft 21 and the lower arm driving portion 15 are provided. With this, the lower arm 20, the upper arm 30, and the hand 2 are integrally lifted and lowered in the Z direction. Thus, the hand 2 can be lifted and lowered between a lifted position and a lowered position. A height position of the lowered position is set to be lower than a height position of the base 102 of the FOUP 101. A height position of the lifted position is set to be higher than a height position of the uppermost substrate supporting portion 101d.

The lower arm 20 is, for example, a hollow plate-shaped member and is formed in a substantially strip shape in a plan view. As shown in FIG. 3, the lower arm 20 includes the lower arm rotating shaft 21 formed so as to project downward from a bottom surface of a base end portion of the lower arm 20. The lower arm rotating shaft 21 is attached to the base 10 so as to be turnable about the rotation axis L1 extending in the Z direction. Therefore, the lower arm 20 is configured to turn on an X-Y plane. In the present embodiment, the rotation axis L1 constitutes a reference point O on the X-Y plane.

A lower arm turn driven gear 22 is fixed to a lower end portion of the lower arm rotating shaft 21. The lower arm turn driven gear 22 is provided at the same height position as the lower arm turn main driving gear 16 of the base 10 and meshes with the lower arm turn main driving gear 16. An upper arm driving portion 25 including a servo motor is provided in the lower arm 20. The upper arm driving portion 25 includes an upper arm turn main driving gear 26.

An angular position of the lower arm 20 relative to the base 10 around the rotation axis L1 is detected by an encoder of the servo motor of the lower arm driving portion 15.

The upper arm 30 is, for example, a hollow plate-shaped member and is formed in a substantially strip shape in a plan view. As shown in FIG. 3, the upper arm 30 includes an upper arm rotating shaft 31 formed so as to project downward from a bottom surface of a base end portion of the upper arm 30. The upper arm rotating shaft 31 is attached to the lower arm 20 so as to be turnable about a rotation axis L2 extending in parallel with the rotation axis L1. Therefore, the upper arm 30 is configured to turn on the X-Y plane.

An upper arm turn driven gear 32 is fixed to a lower end portion of the upper arm rotating shaft 31. The upper arm turn driven gear 32 is provided at the same height position as the upper arm turn main driving gear 26 of the lower arm 20 and meshes with the upper arm turn main driving gear 26. A hand driving portion 35 including a servo motor is provided in the upper arm 30. The hand driving portion 35 includes a hand turn main driving gear 36.

An angular position of the upper arm 30 relative to the lower arm 20 around the rotation axis L2 is detected by an encoder of the servo motor of the upper arm driving portion 25.

The hand 2 includes: the wrist 2*a* formed at the base end side of the hand 2; and the blade 2*b* formed at a tip end side of the hand 2. The wrist 2*a* and the blade 2*b* are continuously formed.

The wrist 2*a* includes a hand rotating shaft 41 formed so as to project downward from a bottom surface of a base end portion of the wrist 2*a*. The hand rotating shaft 41 is attached to the hand 2 so as to be turnable about a rotation axis L3 extending in parallel with the rotation axes L1 and L2. Therefore, the hand 2 is configured to turn on the X-Y plane.

A hand turn driven gear 42 is fixed to a lower end portion of the hand rotating shaft 41. The hand turn driven gear 42 is provided at the same height position as the hand turn main driving gear 36 and meshes with the hand turn main driving gear 36.

An angular position of the hand 2 relative to the upper arm 30 around the rotation axis L3 is detected by an encoder of the servo motor of the hand driving portion 35.

The lower arm driving portion 15 and the upper arm driving portion 25 constitute an arm driving portion. The arm driving portion drives the lower arm 20 and the upper arm 30 to move the hand 2 on the X-Y plane.

The wrist 2*a* includes the camera 3 attached to an upper surface of the base end portion of the wrist 2*a*. The camera 3 is attached in such a direction as to be able to take an image of the blade 2*b* at which the substrate W is placed. The blade 2*b* is formed in, for example, a thin plate shape. An upper surface of the blade 2*b* corresponds to the "substrate placing portion" of the hand 2, and the substrate W is held by the blade 2*b*. The camera 3 is attached on the rotation axis L3 of the blade 2*b* of the hand 2.

Control Device

Figure 4:
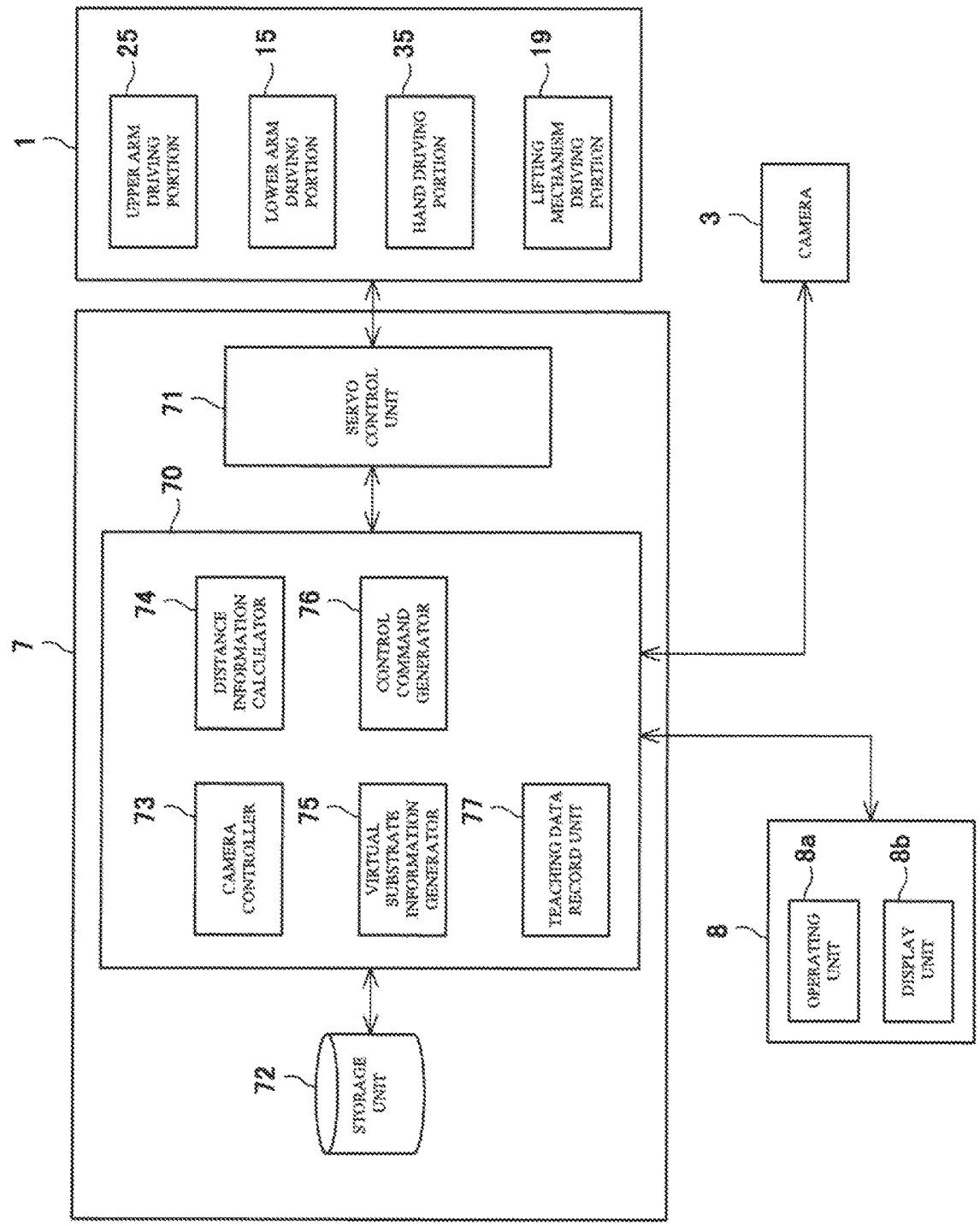
FIG. 4 is a block diagram showing the configuration of a control device of the robot.

FIG. 4 is a block diagram showing the configuration of the control device 7 of the robot 1. For example, the control device 7 includes: a control unit 70 including a calculation unit, such as a CPU; a servo control unit 71; a storage unit 72 including memories, such as a ROM and a RAM; and an interface portion (not shown). The control device 7 may be constituted by a single control device which performs centralized control or may be constituted by a plurality of control devices which cooperate to perform distributed control. In the present embodiment, the control device 7 is connected to a portable operation terminal (hereinafter may be referred to as a "teaching pendant") 8 through an interface portion (not shown). The teaching pendant 8 includes an operating unit 8*b* and a display unit 8*a*. The teaching pendant 8 is arranged outside the semiconductor processing equipment 100 (see FIG. 1) through a cable. The operating unit 8*b* includes: an operation key for operating the robot 1 in a teaching mode; and an operation key for commanding the start, end, stop, and record of the teaching. The control device 7 is configured to: receive operation information and various commands through the operating unit 8*b*; and output various command values, calculation results, images of the camera 3, and the like to the display unit 8*a*. The operator performs teaching work by performing the remote control of the robot 1 using the teaching pendant 8 from an outside of the semiconductor processing equipment 100.

The the control unit 70 includes a camera controller 73, a distance information calculator 74, a virtual substrate information generator 75, a control command generator 76, and a teaching data record unit 77. These functional portions (73 to 77) are functional blocks realized when the the control unit 70 executes predetermined control programs stored in the storage unit 72.

The camera controller 73 controls the camera 3 through the interface portion (not shown). To be specific, the camera controller 73 outputs an image-taking command to the camera 3. The camera controller 73 may adjust an image-taking timing or change the position and posture of the camera 3. In the present embodiment, the position and posture of the camera 3 are set such that the camera 3 can take an image of the blade 2*b* of the hand 2. The camera controller 73 acquires a camera image taken by the camera 3 and stores the camera image in the storage unit 72.

Based on the camera image taken by the camera 3, the distance information calculator 74 calculates distance information from the blade 2*b* (substrate placing portion) of the hand 2 to the substrate W that is the teaching target. To be specific, the distance information calculator 74 calculates the distance information based on the camera image stored in the storage unit 72.

The virtual substrate information generator 75 generates information of a virtual substrate VW virtually arranged at the blade 2*b* of the hand 2 in image data. Information for generating the virtual substrate VW is stored in the storage unit 72 in advance. The generated information of the virtual substrate VW is displayed on a screen by the display unit 8*a* such that the virtual substrate VW is placed at the blade 2*b* of the hand 2.

The control command generator 76 controls an operation of the robot arm 4 based on the operation information generated by the operating unit 8*b* in accordance with the input from the operator. Specifically, the control command generator 76 generates position command values of the servo motors of the driving portions 15, 25, 35, and 19 based on the operation information. The control command generator 76 generates speed command values based on differences between the generated position command values and the detected values (actual values) of the encoders. Then, the control command generator 76 generates torque command values (current command values) based on differences between the generated speed command values and present speed values and generates control commands based on differences between the generated current command values and detected values (actual values) of current sensors. Thus, the control command generator 76 outputs the generated control commands to the servo control unit 71.

The servo control unit 71 generates currents based on the supplied control commands and supplies the generated currents to the servo motors of the driving portions 15, 25, 35, and 19 to operate the robot 1. The servo control unit 71 controls the lower arm driving portion 15 to turn the lower arm 20 on the X-Y plane and also controls the upper arm driving portion 25 to turn the upper arm 30 on the X-Y plane. Further, the servo control unit 71 controls the hand driving portion 35 to turn the hand 2 on the X-Y plane. The servo control unit 71 controls the lifting mechanism driving portion 19 to integrally lift and lower the lower arm 20, the upper arm 30, and the hand 2 in the Z direction.

The teaching data record unit 77 stores in the storage unit 72 as the teaching data the position of the hand 2 when coordinates of a surface of the substrate W as the teaching target and coordinates of a surface of the virtual substrate VW have coincided with each other. In the present embodiment, the teaching data record unit 77 stores the position command values of the servo motors of the driving portions 15, 25, 35, and 19 as the teaching data in the storage unit 72.

The storage unit 72 stores predetermined operation programs, and the the control unit 70 reads and executes the operation programs to control the operation of the robot 1. The predetermined operation programs denote commands which move the hand 2 of the robot 1 to a predetermined position. As described above, as the information for generating the virtual substrate VW, the storage unit 72 stores various information, such as the shape, diameter, material, and weight of the substrate W.

Operation Example

Figure 5:
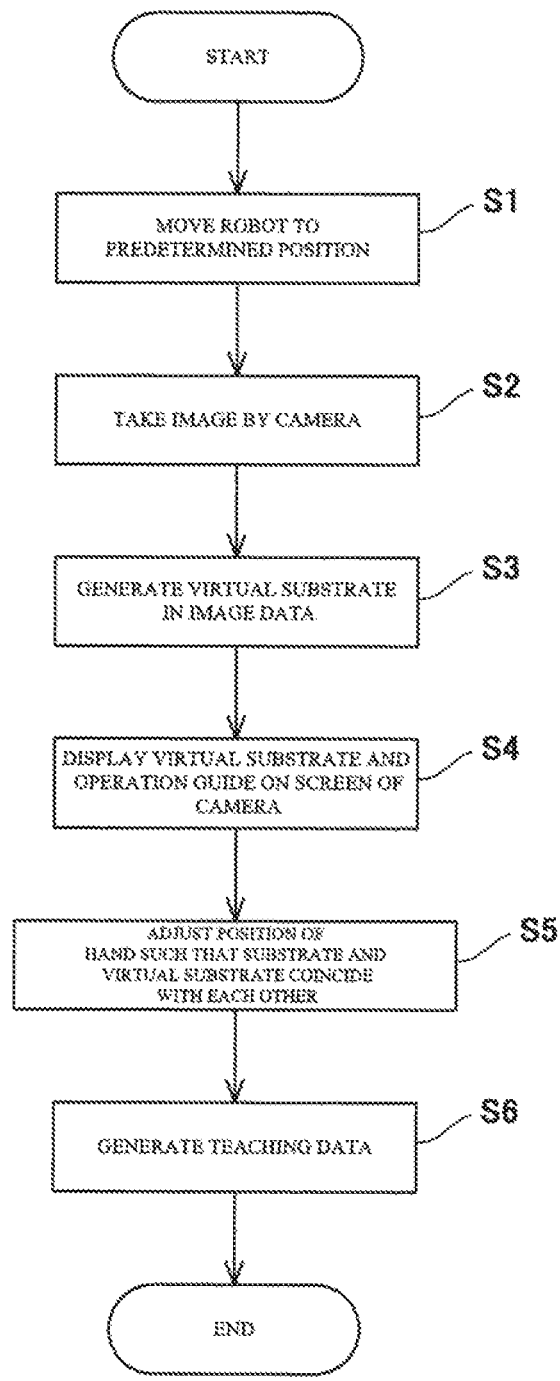
FIG. 5 is a flow chart showing one example of an operation of the robot.

Next, an operation example of the robot 1 when teaching the target position T of the substrate W as the teaching target to the robot 1 will be explained. FIG. 5 is a flow chart showing one example of the operation of the robot 1. FIGS. 6 to 10 show images taken by the camera 3. The teaching target of the present embodiment denotes the position of the hand 2 corresponding to the substrate W placed at a fourteenth shelf, from the top, of the FOUP 101 located at a right side when viewed from the robot 1. The center of this substrate W coincides with the target position T. Hereinafter, the substrate as the teaching target is referred to as the teaching substrate W.

First, the the control unit 70 moves the robot 1 to an initial position (Step S1 in FIG. 5). Specifically, the control command generator 76 generates the position command values of the servo motors of the driving portions 15, 25, 35, and 19 in accordance with the operation program of the robot and outputs the control commands. The servo control unit 71 controls the driving portions 15, 25, 35, and 19 based on the supplied control commands to move the robot 1 to the initial position. The initial position denotes a position at which the camera 3 can take an image of a space S including the teaching substrate W and the blade 2b of the hand 2. In the present embodiment, a route to the initial position is stored as the operation program in the storage unit 72 in advance. However, the robot 1 may be moved to the initial position based on the operation information by operating the operating unit 8b of the teaching pendant 8.

Next, the camera 3 takes the image of the space S including the substrate W and the blade 2b of the hand 2 (Step S2 in FIG. 5). The camera controller 73 stores the camera image, taken by the camera 3, in the storage unit 72.

Next, based on the information, such as the shape of the substrate W, stored in the storage unit 72 in advance, the virtual substrate information generator 75 generates the information of the virtual substrate VW virtually arranged at the blade 2b of the hand 2 in the image data (Step S3 in FIG. 5). At this time, based on the camera image taken by the camera 3, the distance information calculator 74 calculates the distance information from the blade 2b (substrate placing portion) of the hand 2 to the teaching substrate W. In the present embodiment, the distance information calculator 74 calculates the distance information from the blade 2b to the teaching substrate W by pattern matching between the image of the virtual substrate VW and the image of the teaching substrate W.

Figure 6:
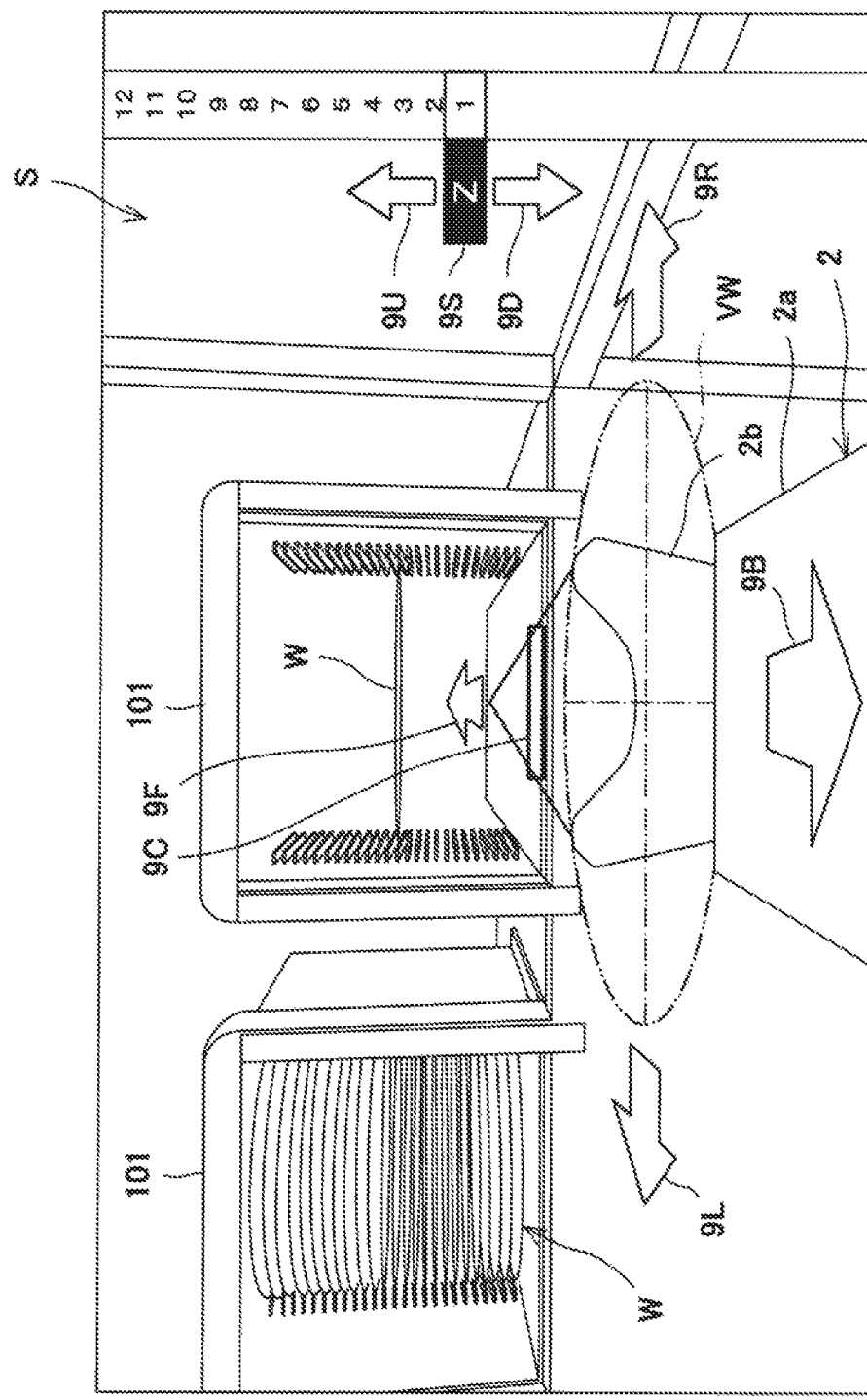
FIG. 6 is a first example of an image taken by a camera.

Next, the display unit 8a displays the image of the image-taking space S taken by the camera 3 (Step S4 in FIG. 5). FIG. 6 shows the camera image displayed on the display unit 8a. As shown in FIG. 6, the teaching substrate W accommodated in the FOUP 101, the virtual substrate VW virtually placed at the blade 2b of the hand 2, and an operation guide 9 are displayed on the screen. The control unit 70 displays the operation guide 9 on the screen by the display unit 8a for the purpose of guiding the position of the hand 2 based on the distance information from the blade 2b to the teaching substrate W such that the virtual substrate VW coincides with the teaching substrate W.

The operation guide 9 includes an upward guide portion 9U, a downward guide portion 9D, a leftward guide portion 9L, a rightward guide portion 9R, a forward guide portion 9F, a backward guide portion 9B, an upward-downward display unit 9S, and a center guide portion 9C. The upward guide portion 9U and the downward guide portion 9D are displayed at a right end on the screen and guide the position of the hand 2 in the upper direction and the lower direction. The upward guide portion 9U is shown by an arrow directed in the upper direction, and the downward guide portion 9D is shown by an arrow directed in the lower direction.

The leftward guide portion 9L and the rightward guide portion 9R are displayed at a left side and right side of the virtual substrate VW on the blade 2b located at a middle of the screen and guide the position of the hand 2 in the left-right direction. The leftward guide portion 9L is shown by an arrow directed in the left direction, and the rightward guide portion 9R is shown by an arrow directed in the right direction.

The forward guide portion 9F and the backward guide portion 9B are displayed at a front side and rear side of the virtual substrate VW on the blade 2b located at the middle of the screen and guide the position of the hand 2 in the front-rear direction. The forward guide portion 9F is shown by an arrow directed in the front direction, and the backward guide portion 9B is shown by an arrow directed in the rear direction. The upward-downward display unit 9S is displayed between the upward guide portion 9U and the downward guide portion 9D located at the right end of the screen and shows a present position of the hand 2 in the upper-lower direction (Z). The center guide portion 9C has a rectangular shape passing through a central axis of the hand 2 and is displayed between the virtual substrate VW on the blade 2b at the middle of the screen and the forward guide portion 9F.

When the hand is directed in a correct direction, the operation guide 9 is displayed in, for example, green (by diagonal lines in the drawings). When the hand is not directed in the correct direction, the operation guide 9 is displayed in red (black in the drawings). Herein, the correct direction denotes such a direction that the virtual substrate VW coincides with the teaching substrate W.

Figure 7:
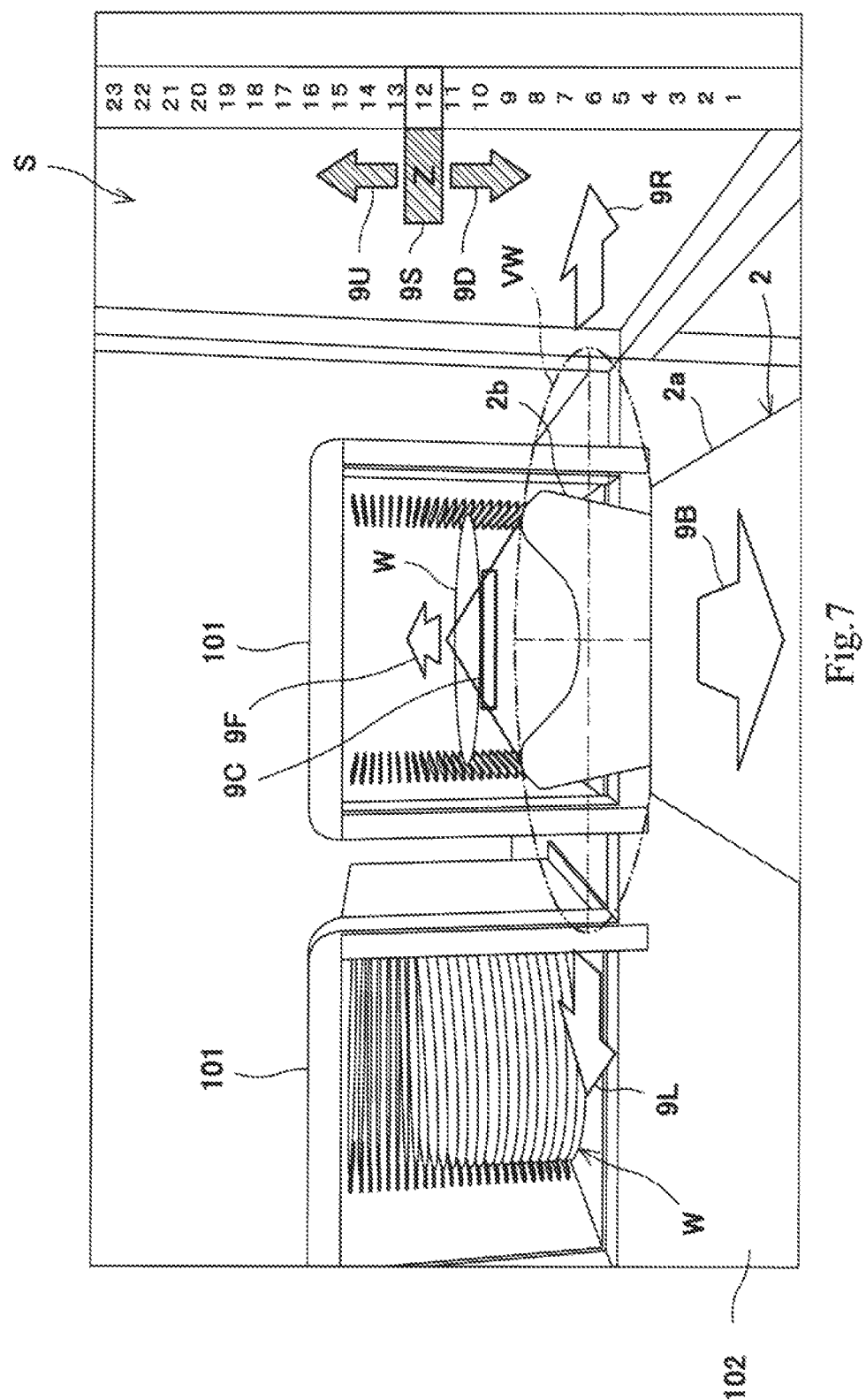
FIG. 7 is a second example of the image taken by the camera.

Next, the operator operates the operating unit 8b to adjust the position of the hand 2 such that the virtual substrate VW coincides with the teaching substrate W (Step S5 in FIG. 5). As shown in FIG. 6, at the initial position, the upward-downward display unit 9S located at the right end on the screen is displayed in red. Herein, a present value of the hand 2 in the upper-lower direction (Z) is a minimum value (1). Therefore, first, the operator operates the position of the hand 2 in the upper-lower direction. The operator operates the operating unit 8b in accordance with the upward guide portion 9U, the downward guide portion 9D, and the upward-downward display unit 9S located at the right end of the screen. In accordance with the operation information generated by the operating unit 8b, the control unit 70 controls the operation of the robot arm 4 such that a height position of the virtual substrate VW coincides with a height position of the teaching substrate W. FIG. 7 shows a camera image when the position of the hand 2 in the upper-lower direction has been adjusted to the correct position. As shown in FIG. 7, display colors of the upward guide portion 9U, the downward guide portion 9D, and the upward-downward display unit 9S have been changed to green (diagonal lines). With this, the operator can recognize that the height position of the virtual substrate VW has coincided with the height position of the teaching substrate W.

Figure 8:
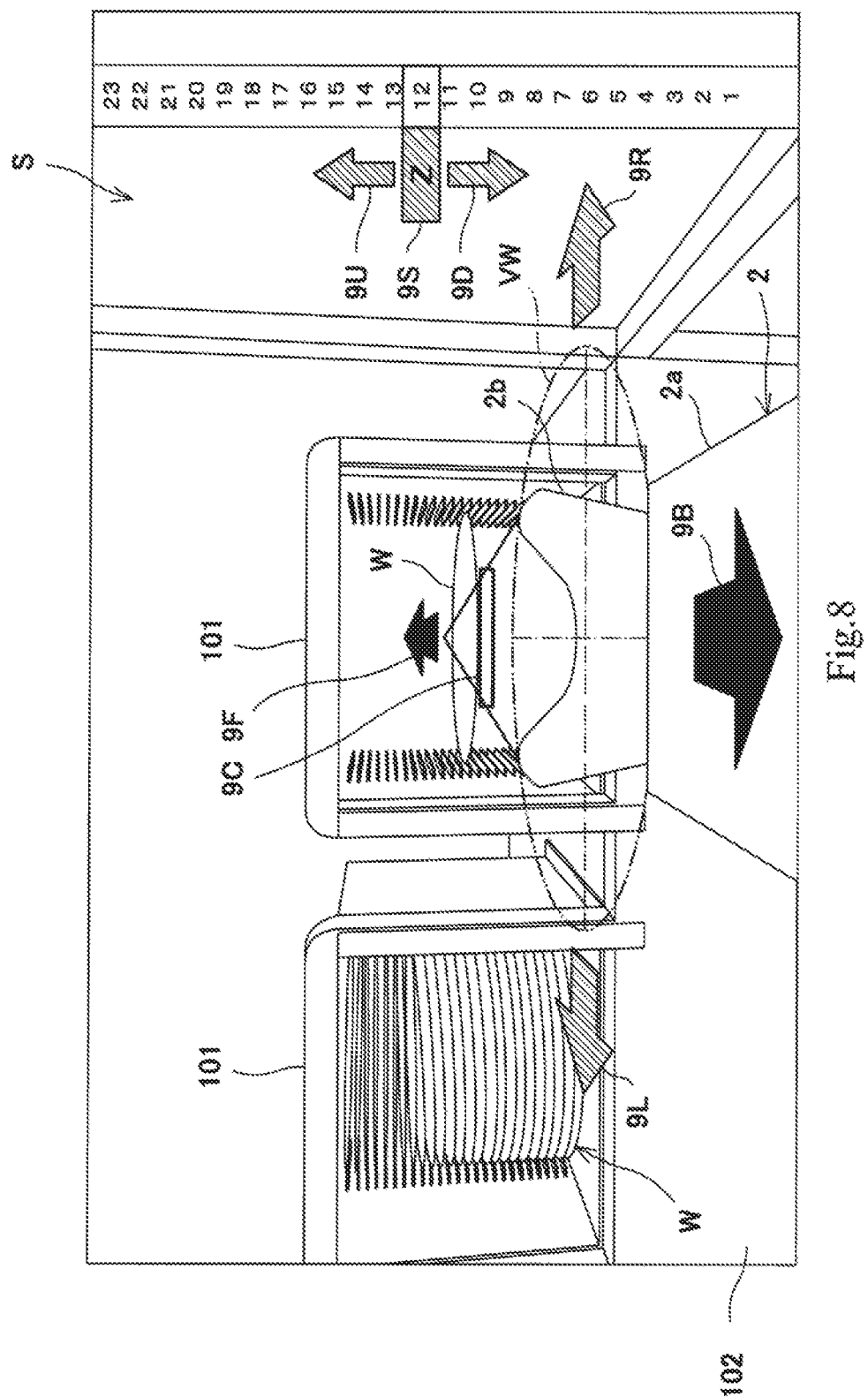
FIG. 8 is a third example of the image taken by the camera.

Next, the operator operates the position of the hand 2 in the left-right direction. The operator operates the operating unit 8b in accordance with the leftward guide portion 9L and the rightward guide portion 9R displayed at the left and right sides of the virtual substrate VW located at the middle of the screen. In accordance with the operation information generated by the operating unit 8b, the control unit 70 controls the operation of the robot arm 4 such that the position of the virtual substrate VW in the left-right direction coincides with the position of the teaching substrate W in the left-right direction. FIG. 8 shows a camera image when the position of the hand 2 in the left-right direction has been adjusted to the correct position. As shown in FIG. 8, the display colors of the leftward guide portion 9L and the rightward guide portion 9R have been changed to green (diagonal lines). On the other hand, the forward guide portion 9F and the backward guide portion 9B displayed at the front and rear sides of the virtual substrate VW located at the middle of the screen are displayed in red (black). With this, the operator can recognize that: the position of the virtual substrate VW in the left-right direction has coincided with the position of the teaching substrate W in the left-right direction; but the position of the virtual substrate VW in the front-rear direction has not coincided with the position of the teaching substrate W in the front-rear direction.

Figure 9:
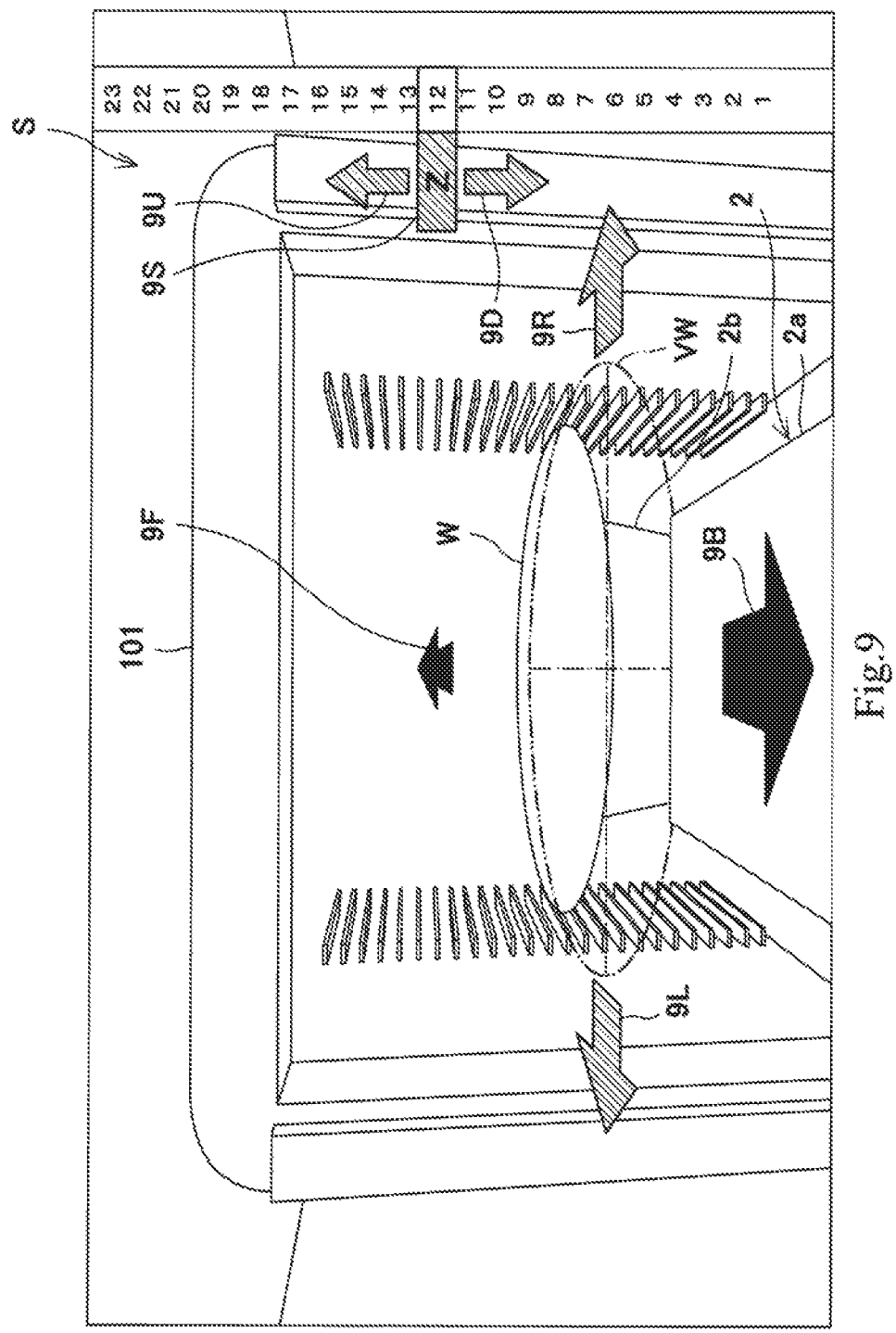
FIG. 9 is a fourth example of the image taken by the camera.
Figure 10:
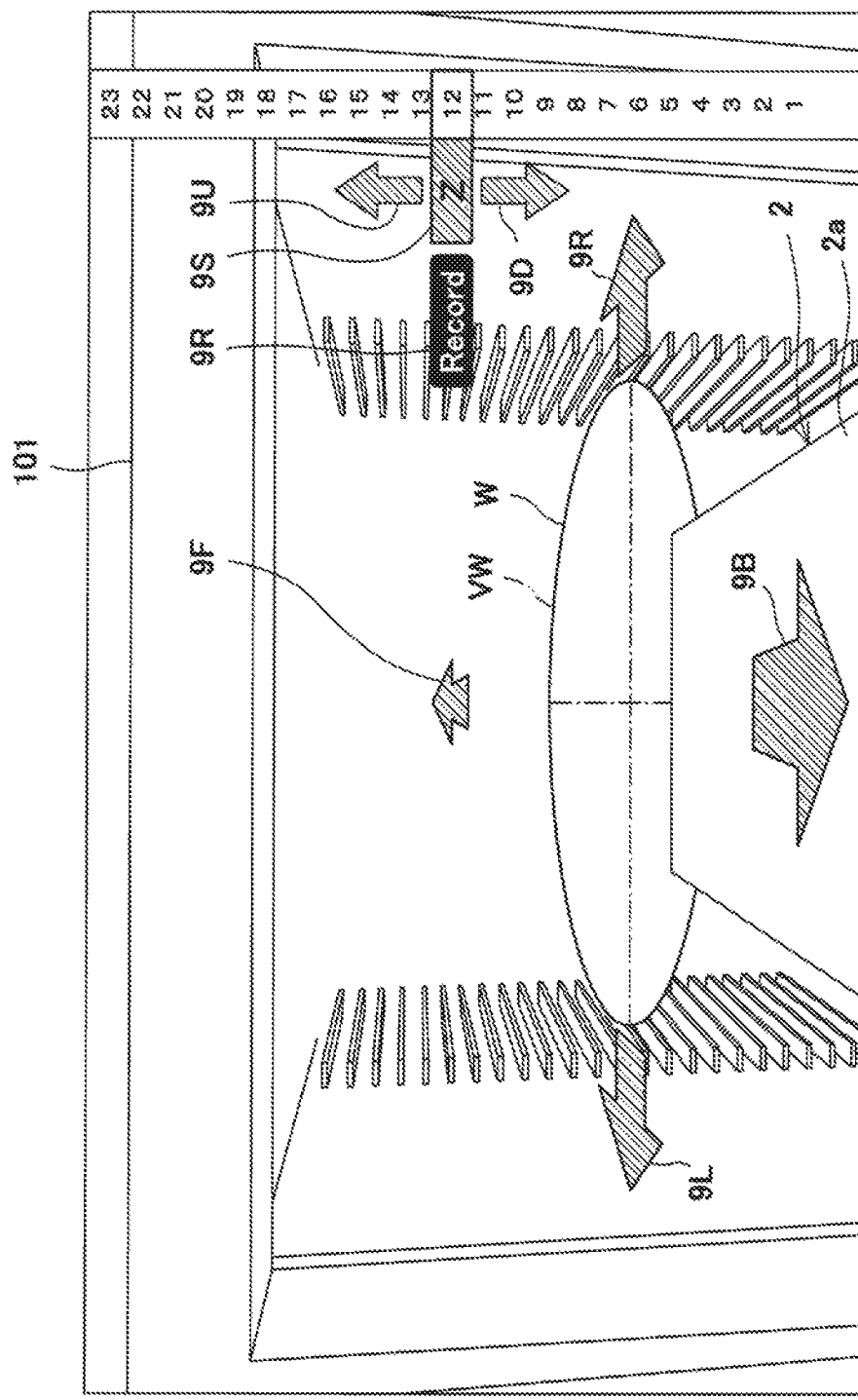
FIG. 10 is a fifth example of the image taken by the camera.

Finally, the operator operates the position of the hand 2 in the front-rear direction. The operator operates the operating unit 8b in accordance with the forward guide portion 9F and the backward guide portion 9B displayed at the front and rear sides of the virtual substrate VW located at the middle of the screen. At this time, the operator operates the operating unit 8b such that the center of the virtual substrate VW displayed on the screen moves close to the center of the center guide portion 9C having the rectangular shape. In accordance with the operation information generated by the operating unit 8b, the control unit 70 controls the operation of the robot arm 4 such that the position of the virtual substrate VW in the front-rear direction coincides with the position of the teaching substrate W in the front-rear direction. FIG. 9 is a camera image in the middle of an operation of adjusting the hand 2 in the front-rear direction. As shown in FIG. 9, although the hand 2 is moving in the front direction, the forward guide portion 9F and the backward guide portion 9B are still shown in red (black). Therefore, the operator can recognize that the virtual substrate VW is not located at the correct position, so that the operator continues the operation in the front direction by the operating unit 8b such that the center of the virtual substrate VW moves close to the center of the center guide portion 9C having the rectangular shape. FIG. 10 shows a camera image when the position of the hand 2 in the front-rear direction has been adjusted to the correct position. As shown in FIG. 10, since the display colors of the forward guide portion 9F and the backward guide portion 9B have been changed from red (black) to green (diagonal lines), the operator can recognize that the hand 2 has been adjusted to the position of the teaching substrate W. Instead of the change of the color, the virtual substrate VW may flicker. As shown in FIGS. 6 to 10, only a part of an outer edge of the teaching substrate W is shown, and the teaching substrate is not entirely shown. However, the virtual substrate VW can be made to coincide with the teaching substrate W in accordance with the operation guide 9. When the control unit 70 determines that the virtual substrate VW has coincided with the teaching substrate W, the control unit 70 makes the display unit 8a display a word "Record" in red. With this, the operator pushes a record button of the operating unit 8b.

Finally, the teaching data record unit 77 stores in the storage unit 72 as the teaching data the position of the hand 2 when the virtual substrate VW has coincided with the teaching substrate W (Step S6 in FIG. 5). Herein, "storing the position of the hand 2 as the teaching data" denotes that the position of the hand 2 is stored (registered) as information, such as the operation program, that is reproducible by the control device 7. In the present embodiment, the teaching data record unit 77 stores the position command values of the servo motors of the driving portions 15, 25, 35, and 19 as the teaching data in the storage unit 72.

Therefore, according to the present embodiment, the virtual substrate VW generated on the blade 2b of the hand 2 is displayed on the screen by the display unit 8a together with the teaching substrate W arranged at the target position T (see FIG. 6, for example). On this account, the operator can control the operation of the robot arm 4 by operating the operating unit 8b while watching the screen such that the virtual substrate VW coincides with the teaching substrate W. By storing the position of the hand 2 at this time as the teaching data, the position of the hand 2 corresponding to the target position T can be taught to the robot 1. With this, even if the skill of the operator is insufficient, the position of the hand can be easily and accurately taught to the robot.

Since the operation guide 9 for guiding the position of the hand 2 such that the virtual substrate VW coincides with the teaching substrate W is displayed on the screen, the operator can easily operate the operation guide 9.

Further, since the operation guide 9 includes the upward guide portion 9U, the downward guide portion 9D, the leftward guide portion 9L, the rightward guide portion 9R, the forward guide portion 9F, the backward guide portion 9B, the upward-downward display unit 9S, and the center guide portion 9C, the operator can further easily operate the position of the hand 2 in the upper-lower direction, the front-rear direction, and the left-right direction.

It should be noted that: the display unit 8a may have a touch panel function; and the operator may touch the upward guide portion 9U, the downward guide portion 9D, the leftward guide portion 9L, the rightward guide portion 9R, the forward guide portion 9F, or the backward guide portion 9B on the screen to input the position of the hand 2 in the upper-lower direction, the left-right direction, or the front-rear direction. With this, the operator can touch each guide portion on the screen to input the position of the hand 2, and therefore, the operator can easily operate the position of the hand 2. Further, the operation guide 9 may include a guide portion configured to guide the position of the hand in a rotational direction, or the position of the hand in the rotational direction may be input through a touch panel.

When the hand 2 is directed in such a direction that the virtual substrate VW coincides with the teaching substrate W, the operation guide 9 is displayed in green. When the hand 2 is not directed in such direction, the operation guide 9 is displayed in red. Therefore, the operator can determine based on the color on the screen whether or not a teaching state is correct. Thus, the operator can more easily operate the position of the hand 2. It should be noted that the display colors used for informing the operator of whether or not the teaching state is correct may be the other colors. Further, the teaching state may be informed by sound, or the degree of completion of the teaching may be shown by a waveform or a gauge.

Other Embodiments

In the present embodiment, the distance information calculator 74 calculates the distance information from the blade 2b to the teaching substrate W by the pattern matching between the image of the virtual substrate VW and the image of the teaching substrate W. However, the present embodiment is not limited to this. The distance information to a target object (teaching substrate W) may be calculated by a known method. For example, the distance information to an object may be acquired by: attaching a color filter to a lens of the camera 3; and performing image analysis of blurs and color drifts generated in a taken image in accordance with a distance to the object.

In the present embodiment, an actual semiconductor wafer is used as the teaching substrate W. However, a simulated substrate having the same shape as an actual substrate may be used.

In the present embodiment, the camera 3 is fixed and attached to the wrist 2a of the hand 2. However, the camera 3 may be detachable. In this case, the camera 3 is attached during the teaching and may be detached when the robot 1 operates in a repeat mode.

In the present embodiment, a plurality of cameras 3 may be arranged, or a three-dimensional camera may be used. The three-dimensional camera simultaneously takes images of a target object from different directions to generate parallaxes, thereby acquiring the distance information to the target object. The three-dimensional camera can generate coordinate data of a surface of the target object in a predetermined coordinate system. The three-dimensional camera is a type of stereo camera. The three-dimensional camera includes a pair of cameras arranged away from each other by a predetermined distance, and these cameras include respective image pickup elements. The three-dimensional camera may acquire not only the distance information but also color information (RGB, etc.) of the target object. Further, the three-dimensional camera may emit a laser and acquire the distance information to a reflection point from a reflection position and a reflection time.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the scope of the present invention.

INDUSTRIAL APPLICABILITY

The present invention is useful when teaching the position of a hand of a robot configured to carry a substrate.

REFERENCE SIGNS LIST 1 robot
2 hand
2a wrist
2b blade (substrate placing portion)
3 camera
4 robot arm
7 control device (robot controller)
8 portable operation terminal (teaching pendant)
8a display unit
8b operating unit
9 operation guide
10 base
20 lower arm
30 upper arm
70 control unit
71 servo control unit
72 storage unit
73 camera controller (image data acquirer)
74 distance information calculator
75 virtual substrate information generator
76 control command generator
77 teaching data record unit
100 semiconductor processing equipment
101 FOUP
102 base (FOUP)
110 substrate processing apparatus
S image-taking space, VW virtual substrate, W substrate

The invention claimed is:

1. A robot configured to carry a substrate to a substrate target position at which the substrate is to be placed, the robot comprising:
a robot arm;
a hand attached to a tip end of the robot arm;
a camera fixed and attached to a portion of the hand other than a substrate placing portion of the hand so as to take an image of the substrate placing portion, the substrate being placed at the substrate placing portion;
an image data acquirer configured to acquire image data taken by the camera, the image data including a teaching substrate and the substrate placing portion of the hand, the teaching substrate being arranged as a teaching target at the substrate target position;
a virtual substrate information generator configured to generate information of a virtual substrate virtually arranged at the substrate placing portion of the hand in the image data;
an operating unit configured to receive an input and generate operation information corresponding to the input;
a screen display unit configured to display an image of the teaching substrate and an image of the virtual substrate on a screen;
a robot operation control unit configured to control an operation of the robot arm in accordance with the operation information generated by the operating unit; and
a teaching data record unit configured to store, as teaching data, a position of the hand when the virtual substrate has coincided with the teaching substrate.

2. The robot according to claim 1, wherein the camera is fixed and attached to a base end portion of the hand.

3. The robot according to claim 1, further comprising a distance information calculator configured to calculate distance information from the substrate placing portion to the teaching substrate based on the image data of the camera, wherein
the screen display unit displays on the screen an operation guide configured to guide a position of the hand based on the distance information from the substrate placing portion to the teaching substrate such that the virtual substrate coincides with the teaching substrate.

4. The robot according to claim 3, wherein the distance information calculator calculates the distance information from the substrate placing portion to the teaching substrate by pattern matching between the image of the virtual substrate and the image of the teaching substrate.

5. The robot according to claim 3, wherein the operation guide includes:
an upward-downward guide portion configured to guide the position of the hand in an upper-lower direction;
a leftward-rightward guide portion configured to guide the position of the hand in a left-right direction; and
a forward-backward guide portion configured to guide the position of the hand in a front-rear direction.

6. The robot according to claim 5, wherein the screen display unit includes a touch panel configured such that an operator touches the upper-downward guide portion, the left-right direction guide portion, or the front-rear direction guide portion on the screen to input the position of the hand in the upper-lower direction, the left-right direction, or the front-rear direction.

7. The robot according to claim 3, wherein:
when the hand is directed in such a direction that the virtual substrate coincides with the teaching substrate, the operation guide is displayed in a first color; and
when the hand is not directed in the direction, the operation guide is displayed in the other color.

8. The robot according to claim 1, wherein the operating unit and the display unit are mounted on a portable operation terminal.

9. A control device of a robot,
the robot comprising:
a robot arm;
a hand attached to a tip end of the robot arm; and
a camera fixed and attached to a portion of the hand other than a substrate placing portion of the hand so as to take an image of the substrate placing portion, a substrate being placed at the substrate placing portion, wherein
the robot carries the substrate to a substrate target position at which the substrate is to be placed,
the control device comprising:
an image data acquirer configured to acquire image data taken by the camera, the image data including a teaching substrate and the substrate placing portion of the hand, the teaching substrate being arranged as a teaching target at the substrate target position;
a virtual substrate information generator configured to generate information of a virtual substrate virtually arranged at the substrate placing portion of the hand in the image data;
an operating unit configured to receive an input and generate operation information corresponding to the input;
a screen display unit configured to display an image of the teaching substrate and an image of the virtual substrate on a screen;
a robot operation control unit configured to control an operation of the robot arm in accordance with the operation information; and
a teaching data record unit configured to store, as teaching data, a position of the hand when the virtual substrate has coincided with the teaching substrate.

10. A method of teaching a position of a hand of a robot configured to carry a substrate to a substrate target position at which the substrate is to be placed,
the method comprising:
arranging a teaching substrate as a teaching target at the substrate target position;
fixing and attaching a camera to a portion of the hand other than a substrate placing portion of the hand such that the camera takes an image of the substrate placing portion, the substrate being placed at the substrate placing portion;
moving the robot to a predetermined position at which the camera is able to taken an image of the teaching substrate and the substrate placing portion of the hand;
taking the image of the teaching substrate and the substrate placing portion of the hand by the camera;
generating information of a virtual substrate virtually arranged at the substrate placing portion of the hand in image data taken by the camera;
receiving an input and generating operation information corresponding to the input by an operating unit;
displaying an image of the teaching substrate and an image of the virtual substrate on a screen by a screen display unit;
controlling an operation of the robot arm in accordance with the operation information; and
storing in a storage unit as teaching data, a position of the hand when the virtual substrate has coincided with the teaching substrate.

11. The robot according to claim 4, wherein the operation guide includes:
an upward-downward guide portion configured to guide the position of the hand in an upper-lower direction;
a leftward-rightward guide portion configured to guide the position of the hand in a left-right direction; and
a forward-backward guide portion configured to guide the position of the hand in a front-rear direction.

12. The robot according to claim 4, wherein:
when the hand is directed in such a direction that the virtual substrate coincides with the teaching substrate, the operation guide is displayed in a first color; and
when the hand is not directed in the direction, the operation guide is displayed in the other color.

13. The robot according to claim 5, wherein:
when the hand is directed in such a direction that the virtual substrate coincides with the teaching substrate, the operation guide is displayed in a first color; and
when the hand is not directed in the direction, the operation guide is displayed in the other color.

14. The robot according to claim 6, wherein:
when the hand is directed in such a direction that the virtual substrate coincides with the teaching substrate, the operation guide is displayed in a first color; and
when the hand is not directed in the direction, the operation guide is displayed in the other color.

15. The robot according to claim 2, wherein the operating unit and the display unit are mounted on a portable operation terminal.

16. The robot according to claim 3, wherein the operating unit and the display unit are mounted on a portable operation terminal.

17. The robot according to claim 4, wherein the operating unit and the display unit are mounted on a portable operation terminal.

18. The robot according to claim 5, wherein the operating unit and the display unit are mounted on a portable operation terminal.

19. The robot according to claim 6, wherein the operating unit and the display unit are mounted on a portable operation terminal.

20. The robot according to claim 7, wherein the operating unit and the display unit are mounted on a portable operation terminal.

* * * * *